(12) United States Patent
Naura et al.

(10) Patent No.: US 7,237,157 B2
(45) Date of Patent: Jun. 26, 2007

(54) PROCEDURE AND DEVICE FOR IDENTIFYING AN OPERATING MODE OF A CONTROLLED DEVICE

(75) Inventors: David Naura, Aix en Provence (FR); Bertrand Bertrand, Trets (FR); Mohamad Chehadi, Aix en Provence (FR)

(73) Assignee: STMicroelectronics SA, Montrouge (FR)

( * ) Notice: Subject to any disclaimer, the term of this patent is extended or adjusted under 35 U.S.C. 154(b) by 233 days.

(21) Appl. No.: 10/844,978

(22) Filed: May 13, 2004

(65) Prior Publication Data

US 2005/0015533 A1 Jan. 20, 2005

(30) Foreign Application Priority Data

May 13, 2003 (FR) .................................. 03 05742

(51) Int. Cl.
*G11C 29/08* (2006.01)
*G11C 29/06* (2006.01)

(52) U.S. Cl. ...................................... 714/720; 714/718

(58) Field of Classification Search ................ 714/720, 714/719, 718, 763; 365/194, 201; 710/307
See application file for complete search history.

(56) References Cited

U.S. PATENT DOCUMENTS 5,070,443 A 12/1991 Priem et al.
5,361,230 A * 11/1994 Ikeda et al. ................... 365/194
5,400,342 A * 3/1995 Matsumura et al. ......... 714/719
5,909,559 A * 6/1999 So .............................. 710/307
2001/0015924 A1* 8/2001 Arimoto et al. ............. 365/201

FOREIGN PATENT DOCUMENTS

EP 0 430 128 6/1991

OTHER PUBLICATIONS

French Preliminary Search Report dated Apr. 8, 2004 for French Application No. 03-05742.

* cited by examiner

*Primary Examiner*—Guy Lamarre
*Assistant Examiner*—Dipakkumar Gandhi
(74) *Attorney, Agent, or Firm*—Lisa K. Jorgenson; Stephen Bongini; Fleit Kain Gibbons Gutman Bongini & Bianco P.L.

(57) ABSTRACT

A procedure is provided for identifying an operating mode of a device, such as an EEPROM memory that communicates according to a communication protocol, such as "I2C" (Inter Integrated Circuit). The signal is an "ACK" or "ACKNOWLEDGE" signal. At least one operating mode of a device is identified by a time lag from the time the signal (ACK) is transmitted relative to the time foreseen by the protocol for the signal. This approach can be used to verify that the test mode commands (read or write) have been taken into account correctly.

41 Claims, 7 Drawing Sheets

TESTS MODE INSCRIPTION

PROCEDURE AND DEVICE FOR IDENTIFYING AN OPERATING MODE OF A CONTROLLED DEVICE

CROSS-REFERENCE TO RELATED APPLICATIONS

This application is based upon and claims priority from French Patent Application No. 03-05742, filed May 13, 2003, the entire disclosure of which is herein incorporated by reference.

BACKGROUND OF THE INVENTION

This invention relates to a procedure and resources for identifying an operating mode of a device, called a controlled device, with which a communication is established according to a protocol that is designed to send, at specific times, a signal by the controlled device. This signal can be a return signal in response to a message received, to indicate that the message has been received according to the protocol. This type of signal does not necessarily indicate the mode in which the controlled device operates when sending this signal. When there are several different operating modes for the controlled device, it may be impossible to obtain the current one, particularly if the apparent behavior of the controlled device is the same for two or more possible modes. As an example, these modes can correspond to a normal operating mode and to one or several test modes of the controlled device. The modes can be controlled by internal or external signals of the latter. These signals can also be inside or outside the communication protocol.

For example, the controlled device can operate according to a normal mode and a set of test modes that are different from the normal mode, principally at the configuration level of certain signals, so that it is impossible or difficult to distinguish from the outside between a normal mode and a test mode, or between two different test modes.

This problem is found, among others, in peripheral devices or components that are controlled by a controller or equipment. For example, with semiconductor memories, such as programmable memories and electrically erasable memories (called EEPROM, Electrically Erasable and Programmable Read-Only Memory) that include at least one read and/or write test mode.

There are established communication protocols with memory, in particular, the protocol known by the acronym I2C bus/protocol (I2C stands for "inter integrated circuit"), an analog protocol that allows exchanging data with a memory. These protocols can be used to control a memory, for example, using a command device such as a microcontroller or a test tool. This case is represented by the block diagram in FIG. 1.

The problem then lies in verifying whether the memory has correctly recognized a command to go into test mode and whether it has not remained in normal mode for whatever reason.

Typically, the correct receipt of data is verified using an acknowledgement message, call ACK (acknowledgement) transmitted by the recipient. The bits of the data exchanged, including the ACK signal are transmitted to the clock frequency. In the I2C protocol, exchanges to or from the memory operate on a transmission bus using eight-bit strings, each followed by an ACK bit. The latter is expressed by taking the capacity of the transmission bus at 0. For example, in a dialogue over a bus 6 at the I2C protocol between a microcontroller (MC) 2 and a memory (M) 4 in write mode, an exchange can take on the following form:

MC: transmission of the command "device selection" (DS), encoded over eight bits, that indicates that it is a read or write operation. At the cycle of the ninth bit, the MC goes into standby mode to await a response by the memory.

M: response transmission of an ACK bit, by taking the capacity of the bus at 0 during the above-mentioned ninth cycle.

MC: having been informed of this bias of the taking into account (acknowledgement) of the command, transmission of the data to be written (for a write operation) on an eight-bit string.

M: transmission of an ACK bit indicating the acknowledgement the eight-bit string of data.

The acknowledgement can be in both directions. Therefore, in the above-mentioned example, the MC can also send an ACK bit to indicate to the memory the acknowledgement of a data element sent by the memory.

At the memory level, dialogue management is ensured by a logical part of the application, which can be in the form of a "programmable logic array" or "PLA" residing in the memory M.

The main elements of the memory are identified in the block diagram in FIG. 2, which includes:
- a memory layer 8, comprising a data storage cell matrix,
- an address decoder 10, which allows accessing the cells specified by the addresses provided,
- a read circuit 12, which allows outputting, in an adapted manner, the data read by the memory layer, and
- the application logic, here in the form of PLA 14, which manages the various operating modes by a state machine.

The I2C bus operates over four main wires: a two-way data transmission wire SDA, a clock signal transmission wire SCL, and two Vcc and GND power supply wires. The following are added to the latter: a write-protection wire, WP (write protect), and memory selection wires (normally three wires called E0, E1, and E2). These three wires allow encoding 16 different memory addresses, for example, to cover 16 KB in units of 1 KB.

To select a specific memory, the first string of eight bits sent by the microcontroller (or any other element communicating with the memory) indicates the type of protocol over the first four bits; that is, the device type identifier, and on the next three bits E0, E1, and E3, the memory selected according to the expected encoding remains for this memory. The eighth bit indicates whether it is a read or write operation. The eight consecutive bits transmitted over the SDA line are named b7 (first bit transmitted), b6, ... b0 (last bit) This sequence is summarized in Table 1.

TABLE 1

Example of device selection encoding

| Device type identifier | | | | Validation (Chip Enable) | | | RWbar |
|---|---|---|---|---|---|---|---|
| b7 | b6 | b5 | b4 | b3 | b2 | b1 | b0 |
| 1 | 0 | 1 | 0 | E2 | E1 | E0 | RWbar |

The start and end of a statement are signaled by the bias of a particular combination of logical states of the SCL and SDA signals, as indicated by the chronogram in FIGS. 3a, 3b, and 3c. These chronograms represent, respectively, a sequence on the totality between a start condition and a stop condition (FIG. 3a), the first nine bits exchanged at the beginning (3b) and the last nine bits exchanged before the stop (FIG. 3c).

For the start of the statement, the above-mentioned combination is a high-low transition over the SDA signal while the SCL signals are in the high state. All the memories on the bus are activated—in standby mode—at the time of the start operation. The selected memory is indicated by the fifth, sixth, and seventh bits (E0, E1, E2). At that time, all unselected memories are deselected automatically. The selected memory detects the eighth bit b0 (indicating a read or write operation) and, at the ninth cycle, returns the ACK signal. The microcontroller will then be informed that the selected memory has correctly taken the protocol into account. At this stage, the first memory selection string will have been acknowledged.

In the case of a data write operation, represented by the chronograms in FIGS. 4a and 4b, the microcontroller can either write a single byte (chronogram in FIG. 4a), or write a series of bytes to the consecutive addresses of the memory, which is designated by the page write term (chronogram in FIG. 4b). As indicated in FIGS. 4a and 4b, the microcontroller first transmits a string that includes the write address, then the data over a single eight-bit string (FIG. 4a) or over several strings (FIG. 4b); the number of strings varies from one to sixteen, allowing transmission of up to sixteen eight-bit words. Each string is followed by an ACK bit transmitted by the memory. After the ACK bit of the last string of the last word, the end of the statement is indicated by the combination of SDA and SCL signals constituted by the low-high transition of the SDA signal, with the SCL signal remaining in high state (FIG. 3).

The memory includes a write command pin, called WCbar, which allows denying the writing of data when in state 1. In particular, it allows programming data into the memory and then blocking against any future write operations by connecting the pin to the Vcc power supply. Note that in the chronograms in FIGS. 4a and 4b, the WCbar state is 0. Nevertheless, the memory can be selected and the address bytes can be acknowledged when WCbar is at 1.

The chronograms in FIGS. 5a, 5b, and 5d represent the case of a read operation of the memory according to various modes: reading at the current address (FIG. 5a), reading at a designated address (FIG. 5b), sequential reading from the current address (FIG. 5c), and sequential reading from a designated address (FIG. 5d).

In read mode, the read address designation in the memory operates using a false write operation (FIGS. 5b and 5d). Indeed, the I2C protocol does not foresee the specific address designation command in read mode, but only a write address. Thus, a read operation passes through the transmission of a memory selection through bits E0, E1, and E2, as explained above, then, to the next string, of the address (BYTE ADDR) that corresponds to the read operation location. Nevertheless, instead of following this operation by sending write data, the beginning condition is repeated by again selecting the memory. Only this time, the RWbar bit is placed, not at the low level, as in the write operation, but rather at the high level. This level indicates that the write operation is aborted and that it is indeed a read operation. In response, the memory produces the data of this address on the I2C bus. The ACK signal is then transmitted to each received byte. Note that in this case the ACK signal is transmitted after each consecutive byte by the target device of read data (the microcontroller in this case), and not by the memory.

When only one byte is to be read, the target device emits, when it receives it, a NO ACK signal (active in high state), interrupting the read process of the other data in the memory (FIG. 5a). Indeed, the PLA assumes that any read operation is sequential on consecutive addresses, unless otherwise indicated.

When a read operation of the memory is done from a current address, already designated by a pointer, the operation does not need the address (FIGS. 5a and 5c). This sample case can arise when a data element must be read immediately after it has been written into the memory.

The PLA can be considered as a state machine that manages all the memory operations on the periodicities of nine bits, each comprised of an eight-bit word and a ninth ACK bit. An internal counter is thus foreseen to count the clock cycles.

Before providing a memory to the client, typically an equipment manufacturer, the manufacturer normally performs a series of tests according to various modes. These modes generally use the same protocols as the client modes. In other words, for these tests, exactly the same protocol as the one presented to the client in the notices and specifications (see FIGS. 3, 4, and 5, for example) is used. To distinguish the test modes from the client mode, for the former high-voltage pulses (relative to Vcc) are used and applied to the control pin when writing the WCbar mentioned above. These pulses are applied at different times of the protocol: the arrival time of such a pulse indicates which of the test modes will be used.

Recall that there are three possible states of a memory cell, identified by voltage values VT through the floating grid transistor of the cell, as follows:
virgin: VT=approx.+1V
written (programmed): VT=approx.−1.5V
erased: VT=approx.+3V One of the test modes is a read test designed to determine whether the memory cells have suffered some loss of written or erased data. The reading of a memory cell is done by comparing the level of its voltage with an intermediary threshold voltage CGint produced internally.

This CGint threshold leaves a relatively significant margin with respect to the erase and write limit voltages, which allows accommodating for possible manufacturing derivations or aging. One of the tests performed, called CGext, consists in replacing the CGint threshold by an external threshold, CGext, which is closer to the value foreseen for the state of the cell to be detected that is not the CGint internal threshold.

Typically, the value of the CGext voltage is applied to the WCbar pin at a predetermined time during the read operation. The value of this CGext threshold is chosen in order to provide less tolerance to a possible decline in cell programming voltages to monitor the cells excluded from a project specification, but that could work correctly in client mode given the more tolerant CGint internal threshold.

In other words, in this test mode, a narrower correct operation margin than that of the client mode is imposed. As a result, a memory that lies outside the margins in test mode but within the margin in client mode will read output the data that indeed correspond to the write operation when in client mode, but would produce, on the other had, errors during the reading of the same data in test mode because of the increased severity of the recognition threshold.

To illustrate, FIG. 6 shows, on a vertical voltage scale that increases towards high positive values passing through the peak, the CGint, CGext relative positions for the case of the detection of a cell that is presumed to be at the programming stage, as well as the write (programming) voltage limits. The voltage for this cell must therefore be negative, approximately −1.5V. Typically, the CGint value is fixed close to 1V, for technological reasons. The CGext intermediary voltage is generally given the lowest possible positive value, normally approximately −0.5V (lower threshold values are not generally exploitable).

In order to be able to validate a memory on such a test, first it is necessary to ensure that the memory has recognized the CGext test mode command and that it has not remained untimely in client mode. Analogous considerations are applied for other tests, whether they are reading tests or writing tests.

Therefore, there is no return of memory information that allows verifying whether the command that was transmitted to it has been placed in test mode and acknowledged correctly. In the next steps, the voltage applied on the WCbar pin to establish a test mode will be designated as high voltage, because it is typically a high potential on the order of 12V.

Additional information on the I2C protocol is available from several sources, including the technical notice regarding the serial type of the 16/8/4/2/1 Kbit EEPROM family over the I2C bus of the requesting company, product reference: M24C16, M24C08, M24C04, M24C02, M24C01, publication dated July 02.

SUMMARY OF THE INVENTION

In view of the above, the invention foresees, according to a first aspect, an identification procedure of an operating mode of a device, the device communicating according to a communication protocol the foresees the transmission, at specific times, of a signal by this device, characterized in that identified are at least one operating mode of the device by a difference in the time when the signal is sent relative to the time foreseen by the protocol for this signal.

In implementation mode, the signal is a return signal transmitted in response to a message received by the device.

The communication protocol can be an industry standard protocol, for example, the protocol called "I2C" (Inter Integrated Circuit), the signal being an "ACK" or "ACKNOWLEDGE" signal of this protocol.

A device operating mode can be activated by applying the command signals during these predetermined times, in the following stages:
  analyze a condition, at specific times, indicating the correct acknowledgement of the command,
  if this condition indicates acknowledgement of the command, place in time, the sending of the signal in accordance with this operating mode.

Preferably, for at least one mode to be identified, the sending of the signal is delayed with a predetermined delay relative to the time foreseen by the protocol for this signal.

The procedure can include imposing various differences in time in the transmission of the signal, relative to the time foreseen by the protocol for this signal, to identify the various respective operating modes.

In implementation mode, the mode to be identified is an operating mode of the device among:
  a normal operating mode and at least one test mode, and/or
  a set of possible test modes, each identified by a respective positioning in time of the signal transmission.

The signal can be sent at the time foreseen by the protocol in the case of normal operating mode.

In implementation mode, the protocol works based on clock cycles, the lag of the signal being one or several cycles.

The lag in the signal transmission times can be done by selectively adding at least one state before the signal transmission, each state occupying at least one cycle.

The operation of the device is advantageously governed by a state machine that evolves in consecutive states in accordance with the protocol and that, furthermore, is channeled selectively to at least one other additional state, depending on the operating mode controlled for the device.

At least, some additional states can be accessed in cascade form. The access to a given level of the cascade is a function of the controlled operating mode.

The device can be a memory, for example a programmable type memory, in particular an electrically programmable and erasable memory (EEPROM).

Identification can be used to identify at least one data read test mode and/or to identify at least one data write test mode.

For example, it can be used to identify at least one test including:
  in read mode or write mode:
    a test called "Set JKOTP" to activate at least one specific line of the memory circuits, designed for internal use, for example, to establish traceability follow-up,
  in read mode:
    a direct memory access (DMA) test,
    a test with application of an external cell state level detection threshold (CGext),
    the combination of DMA and CGext tests;
  in write mode:
    a write test without a prerequisite erasure cycle called "write only" (Wonly)
    a test called "checkerboard."

The operating mode can be selected by a mode command signal applied on a contact point at specific times during the operation of the controlled device.

The lag can therefore be produced according to the detection of a signal that extracts the acknowledgement of the mode command signal.

It can be foreseen that any operating mode identified be controlled only through the mode command signal, present at specific times; each of these times corresponds to an operating state or cycle of the controlled device and is associated with a specific operating mode.

In the case of a memory, the mode command signal can be applied on the contact point foreseen for the so-called write control signal normally designed to control the authorization/denial of writing of data; the command signal preferably includes an active state at a relatively high voltage to the write control signal.

According to the second aspect, the invention relates to the detection method of an operating mode of a device, characterized in that this detection works by the bias of a preset communication protocol with this device by implementing the procedure described according to the first aspect. The method includes the following stages:
  previously matching the device with the or each operating mode to be detected and a lag value in the transmission time of the signal specific to this mode,
  establishing communication between the device through the communication protocol,
  determining the transmission time of the signal by the device relative to the one foreseen by the communication protocol, and
  using the matching to obtain the operating mode.

According to a third aspect, the invention relates to a command method of an operating mode to a device and the verification that this command was correctly interpreted by this device, characterized in that this verification is performed by the bias of a preset communication protocol with the device and that implements the procedure according to the first aspect. The method includes the following stages:

previously matching the device with the or each operating mode to be detected and a lag value in the transmission time of the signal of this mode, establishing communication with the device using the communication protocol, controlling the operating mode, determining the transmission time of the signal by the device relative to the one foreseen by the communication protocol, using the matching to obtain the operating mode in which the device is effectively in, and comparing the operating mode thus obtained with the controlled operating mode.

The operating mode control stage can be operated by the contact point foreseen for the write control signal, according to the provisions mentioned above within the framework of the first object of the invention.

According to a fourth aspect, the invention relates to a signaling method by a device, its operating mode, characterized in that the signaling is performed by the bias of a preset communication protocol of this device and in that it implements the procedure according to the first aspect. The method includes, at the device level, the following stages:

previously matching the device with the or each operating mode to be indicated and a lag value in the transmission time of the signal of this mode, reacting to an operating mode activation command, establishing the transmission time of the signal in accordance with the controlled operating mode, in conformance with the preset matching, and sending the signal at the set time.

According to a fifth aspect, the invention relates to a device for identifying an operating mode of a controlled device. The latter communicates according to a communication protocol designed to send, at specific times, a signal by the controlled device, characterized in that the identification device includes resources for identifying at least one operating mode of the device using a time lag at the moment of the signal transmission relatively at the time foreseen by the protocol for this signal.

This device can include, among other elements:

command resources of an operating mode of the controlled device that operates by applying command signals to the controlled device at preset times, analysis resources of a condition, at given times, indicating the correct acknowledgement of the command, resources that are active if this condition indicates the acknowledgement of the command to position in time the transmission of the signal in accordance with the operating mode.

The controlled device can include a state machine that evolves in consecutive states in accordance with the protocol and that, furthermore, is channeled selectively to at least one other additional state, depending on the operating mode controlled for the device.

The device can be a memory, for example a programmable type memory, in particular an electrically programmable and erasable memory (EEPROM).

The aspect presented within the framework of the procedure and methods is applicable mutatis mutandis to the device and, generally, to the hardware resources for implementation.

According to a sixth aspect, the invention relates to a detection device of an operating mode of a controlled device, characterized in that it is operated by the bias of a preset communication protocol with this controlled device by implementing the procedure according to the first aspect. The detection device includes:

resources for storing a match between the or each operating mode to be detected and a lag value in the transmission time of the signal of this mode, resources for establishing communication with the device using the communication protocol, resources for determining the transmission time of the signal through the device relative to the one foreseen by the communication protocol, and resources for using the match to obtain the operating mode.

According to a seventh aspect, the invention relates to a command device of an operating mode to a controlled device and verification that this command has been correctly interpreted by this controlled device, characterized in that it operates through the bias of a preset communication protocol with this controlled device and that it implements the procedure according to the first aspect. The device includes:

resources for pre-matching the device with the or each operating mode to be detected and a lag value in the transmission time of the signal of the mode, resources for establishing communication with the device through the communication protocol, resources for controlling the operating mode, resources for determining the transmission time of the signal by the device relative to the one foreseen by the communication protocol, resources for using the match to obtain the operating mode in which the device is effectively in, and resources for comparing the operating mode thus obtained with the requested operating mode.

According to an eighth aspect, the invention relates to a signaling device that works in a controlled device and is designed to signal the operating mode of the controlled device, characterized in that this signaling works through the bias of a preset communication protocol of the controlled device using resources, implementing the procedure according to the first aspect. The signaling device includes:

resources for storing a match between the or each operating mode to be indicated and a lag value in the transmission time of the signal of this mode, resources for reacting to an operating mode activation command, resources for establishing the transmission time of the signal in accordance with the controlled operating mode, in conformance with the preset match, and resources for sending the signal at the established time.

According to a ninth aspect, the invention relates to a semiconductor memory characterized in that it includes resources for communicating its operating mode by implementing the procedure according to the first aspect.

This memory can be a programmable type memory, in particular an electrically programmable and erasable memory (EEPROM).

According to a tenth aspect, the invention relates to a state machine of a previously mentioned controlled device characterized in that it is configured to implement the procedure according to the first aspect.

The state machine can be implemented in the form of a programmable logic array, also known as PLA.

BRIEF DESCRIPTION OF THE DRAWINGS

The invention and the advantages that it presents will be more evident upon reading the description below of the embodiments, provided exclusively as non-limiting examples by referring to the diagrams attached, in which.

DETAILED DESCRIPTION OF PREFERRED EMBODIMENTS

The preferred embodiments of the invention work within the framework of the I2C protocol whose basis has already been described in the introduction section. This information, as well as the data relative to the operation of EEPROM memories, are used in this description and are not repeated here for conciseness.

According to the invention, a delay is provoked in the transmission of the ACK signal by the memory when the latter is placed in test mode. This allows verifying the acknowledgement of the test mode.

In this preferred embodiment, this provision is obtained by introducing at the PLA level one or several additional states each occupying a clock cycle. The state machine formed by the PLA provokes the passage, when a test mode is controlled, by one or a set of these states before sending the ACK signal. In that way, the appearance of the ACK signal will be delayed by the number of cycles as there are added states, and this time lag will provide an information return that will allow verifying whether the expected test mode command has been executed correctly by the memory. The number of cycles therefore serves, if necessary, to express a test mode within a set.

The operating principle of the embodiment is integrated in the normal practice of controlling a test mode by the application of high voltage pulses over a line accessible by the WCbar pin. Note that this provision can also be available for the client, in particular, in the following cases: if the WCbar line must then be subjected to high voltage, for example, due to a parasite signal that provokes the untimely instauration of a test mode, the client will be informed by the delay of the ACK signal and could then reinitialize the circuits to return to normal mode (client).

Figure 1:
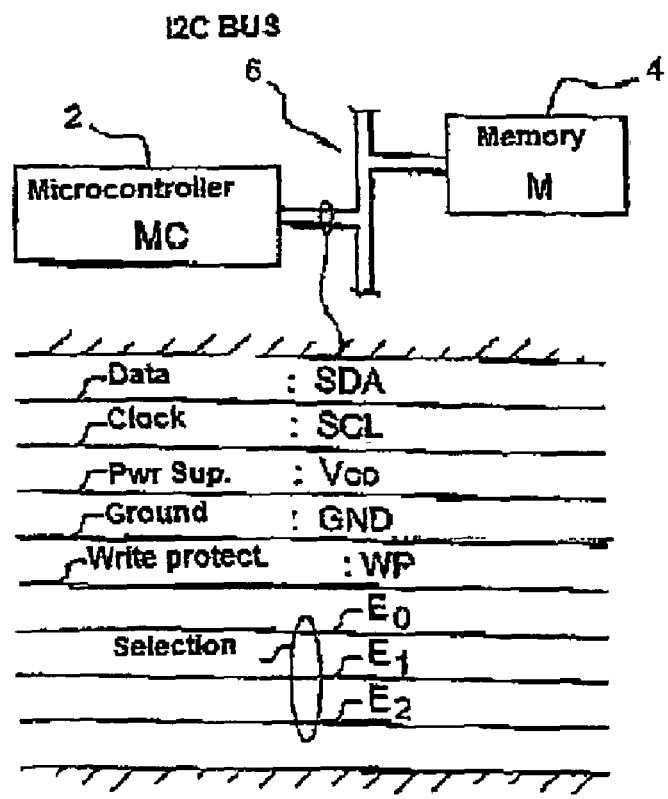
FIG. 1, already described, is a simplified block diagram illustrating a connection through an I2C bus, between a microcontroller and an EEPROM type memory.
Figure 2:
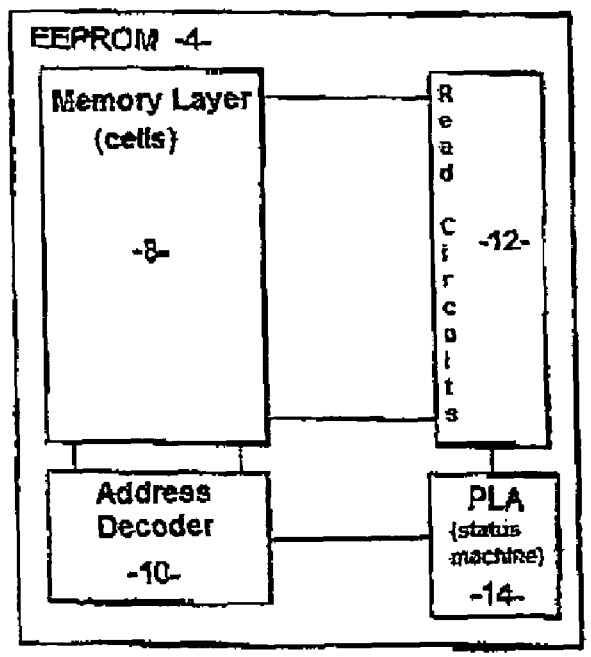
FIG. 2 is a simplified block diagram that provides the main elements of the memory in FIG. 1.
Figure 3A:
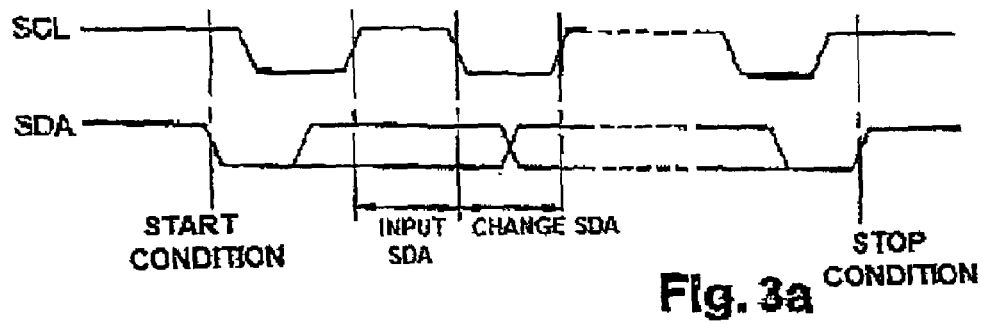
FIGS. 3a to 3c, already described, are general chronograms of the data exchange protocol over the I2C bus.
Figure 3B:
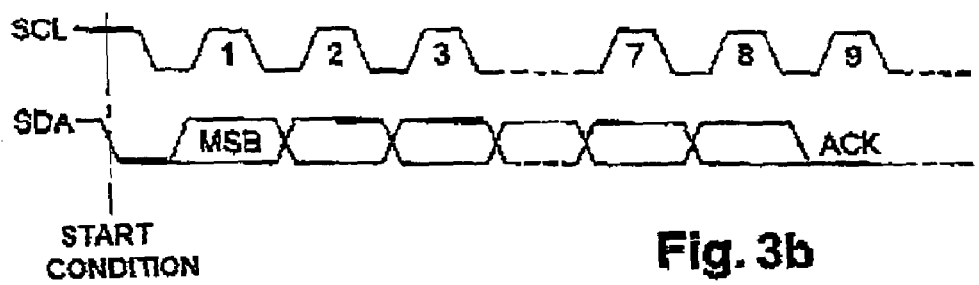
Figure 3C:
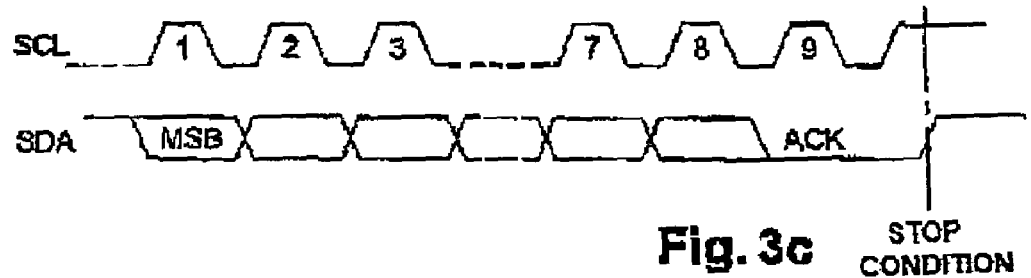
Figure 4A:
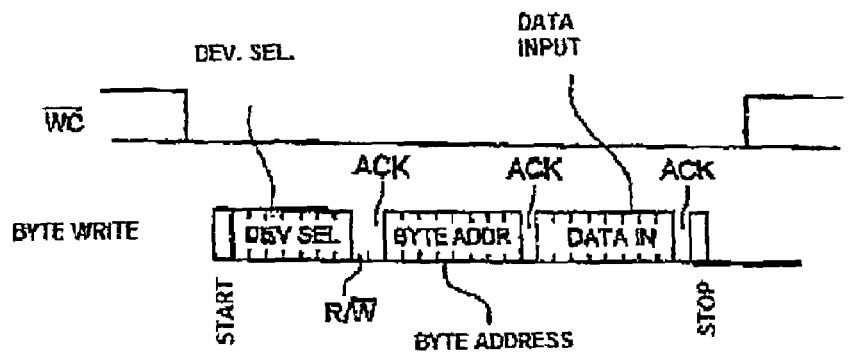
FIGS. 4a and 4b, already described, are write mode sequence diagrams of the I2C protocol, FIGS. 5a to 5d, already described, are read mode sequence diagrams of the I2C protocol.
Figure 4B:
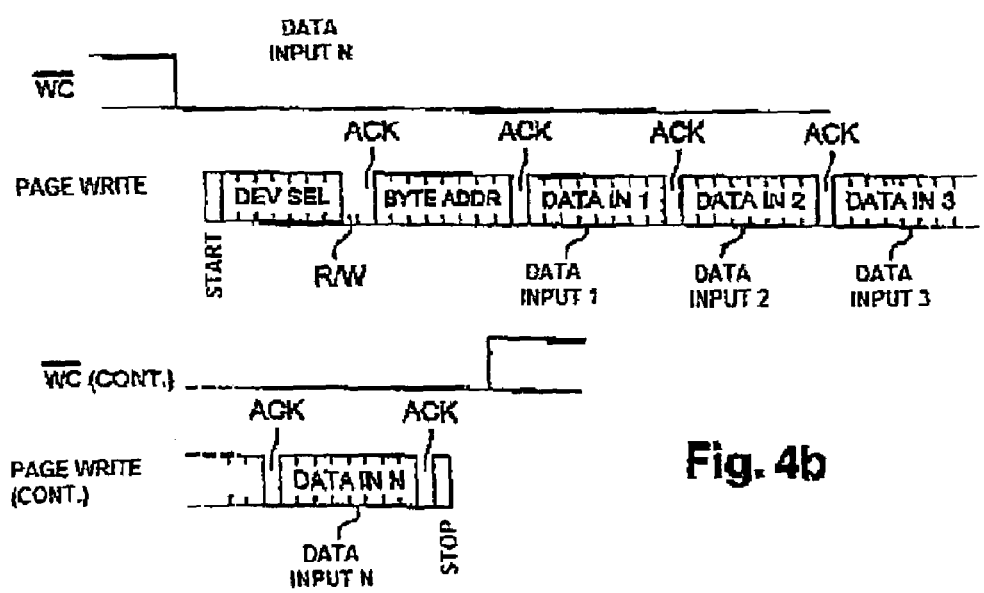
Figure 5A:
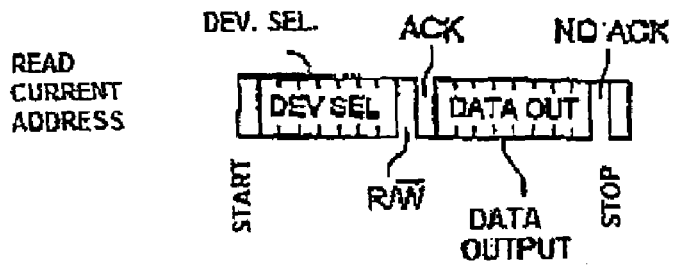
Figure 5B:
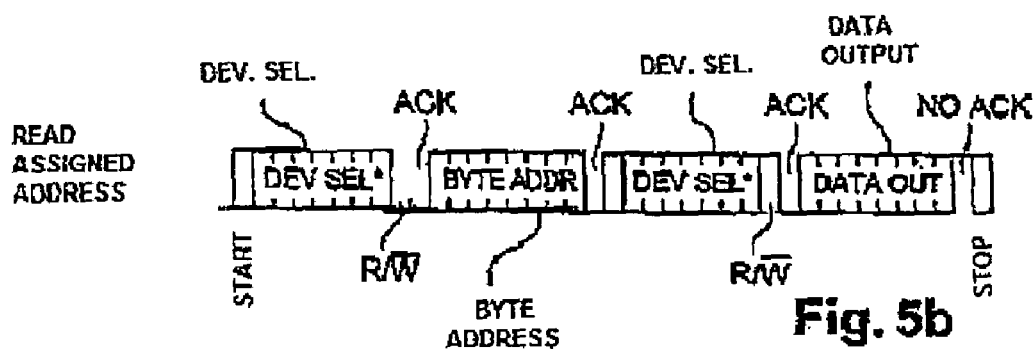
Figure 5C:
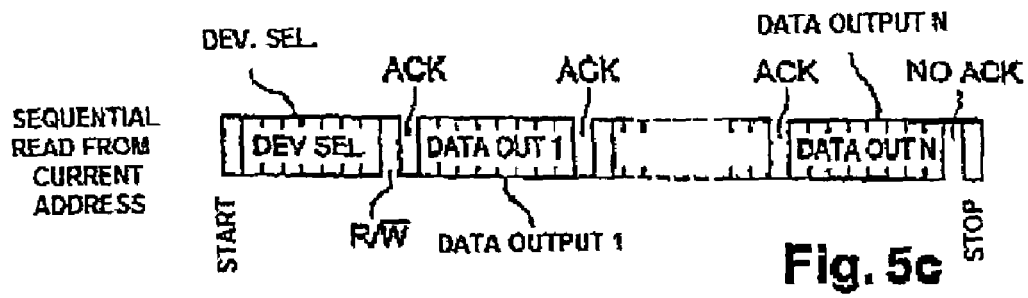
Figure 5D:
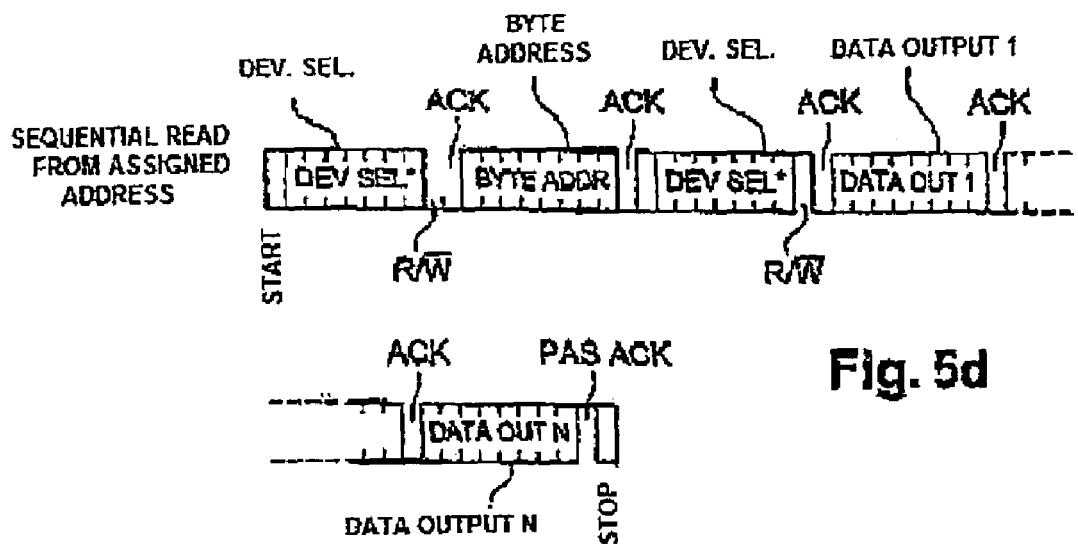

In the embodiment, the PLA 14 (FIG. 2) works over two possible layers:
the AND layer, which receives the inputs, including the possible control signals and test signals, and
the OR layer, which outputs the signals designed to activate the logic.

The solution based on a PLA 14 has the advantage of allowing modifications to the state machine by only changing the connections for an existing configuration, providing certain flexibility with respect to possible updates in the protocol. For example, adding new tests is very easy by using the bias of a PLA, not needing to act on some contacts and requires the intervention at the very least of only one or two masks.

As a variation, it is possible to foresee a logical synthesis solution in which automatic synthesis tools that input a state description and generate logical layers in return, all under the control of a set of clocks.

Note here that with I2C and microwire protocols, the memory must be selected at the end of a write operation. It is then that the internal writing machine is activated; that is, after the eighth bit of the last word sent for writing. In this regard, foreseen are a resources for ensuring that all untimely bits transmitted after this last bit are not taken into account and that writing be denied. These resources establish a write window that closes after this last bit if a subsequent bit appears. This aspect is described in the French Patent Application FR 96 12153 in the name of the assignee.

In writing modes, the adding of a test mode results in a lag of the writing in the test mode. If the user enters randomly in test mode, but the high voltage pulses then required are not present, the writing operation will not be performed from the passing of this authorization window. Therefore, this provides a second level of protection against parasite writing operations for the user that is accidentally in test mode.

An exemplary embodiment according to the invention will now be described by referencing the state machine implemented at the PLA level 14 of the EEPROM memory 4 that is the object of the test. The operation of this state machine is represented by the flowchart in FIGS. 7 to 9.

In this Figure, a state is represented by a cell with small rounded edges, the queries over the logical states of a signal are represented by a diamond containing the name of the queried signal, and the signal generation is represented by a cell with small edges formed by two converging lines.

During an initial stage, two signals are generated, RMEM and ENRE (box C2) to determine the code of the device. This corresponds to the device selection according to the coding of Table I containing eight states b7–b0.

Next, the system passes consecutively on seven of the eight states. These seven states correspond respectively to the eight bits b7, b6, . . . b1 of the device selections code, corresponding to the DI signal.

At the PLA level, the first three states (boxes C4–C10) are used to determine if, for each of them, a 0 or 1 is sent to the respective bits b7, b6, b4, (in the example in Table I, this gives b7=1, b6=0, b5=1, b4=0).

Then, it passes consecutively to the ENRE test, CAM read states for the querying of the E2 (querying of bit3), E1 (querying of bit2), and E0 (querying of bit b1) address signals (boxes C12–C16).

The entry into a test mode, or a selection of a specific test is done by the high voltage bias, normally on the order of 12V, applied on a WCbar pin to the specific state of the state machine. The presence of this high voltage, when correctly taken into account, is indicated by the PRE logical signal that can be accessed internally or externally, as follows:

high voltage over WCbar=>PRE=1;
OV or Vcc over WCbar–>PRE=0.

Inside the memory, the PRE signal is used to activate a data transmission line on which the read or write data will be transported specifically during a test mode. This line, in particular, is used to store previously read configuration information.

The embodiment foresees the possibility of establishing a test mode, called "Set JKOTP" during the b1 bit state. This test mode can be used to activate a specific line (or lines) of memory circuits designed to be used internally, for example, to establish traceability monitoring.

To detect this test mode, the state machine determines the PRE logical level at the b1 state (box C18). If PRE=0, the state machine continues in normal mode and passes to the bit 0 bit state (box C20) as the eighth state.

On the other hand, if PRE=1, indicating the selection of the "Set JKOTP" test mode, the state machine inserts a new state called "set JKOTP" (box C22) before passing to the b0 bit state. In other words, referring to Table I, the action is as if between the state b1 and b0 an additional b1' Set JKOTP state is inserted, which causes a delay of a clock cycle with respect to normal mode. From this, the ACK signal that follows the b0 bit will appear:

either at the ninth clock cycle, if the memory is in normal mode,
or, at the earliest, at the tenth clock cycle, if the memory is in test mode (box C22).

If, in normal mode, the high voltage must be activated in an untimely manner over the WCbar signal, then the ACK signal will not appear at the ninth clock cycle. This non-appearance at the expected time therefore allows alerting that the memory has been taken out of normal operating mode, following an error in the sequence.

Inversely, if the user wishes to pass to test mode, the receipt of the ACK signal not at the tenth clock cycle, but at the ninth, warns of an error indicating that the positioning command in test mode has not been taken into account. For example, this error can be due to a high voltage applied on a WCbar pin that is not high enough, or that the high voltage detector has failed.

Then, the state machine queries the RWbar signal (box 24) to determine if the memory has been placed in read mode (RWbar=1) or in write mode (RWbar=0).

Figure 8:
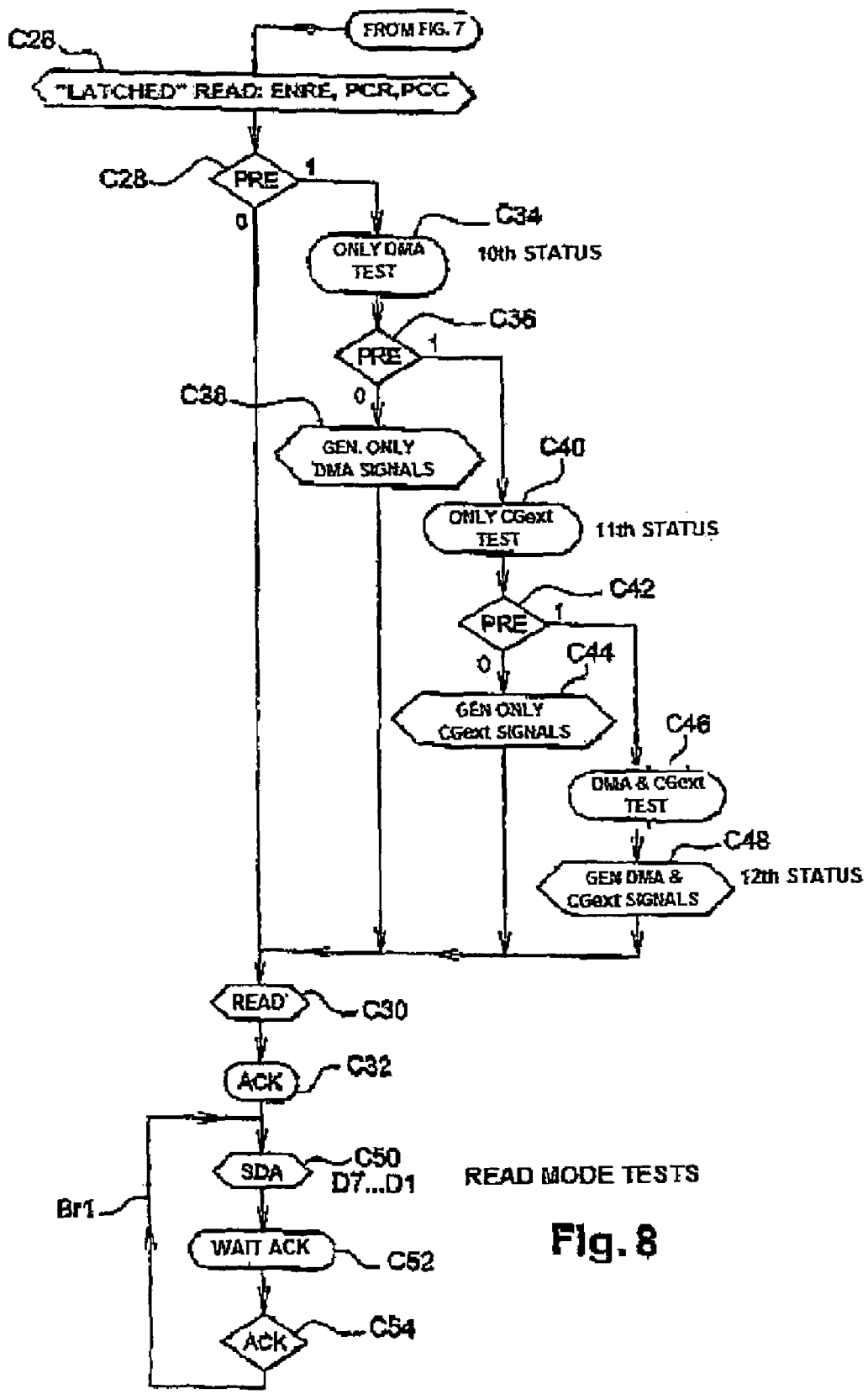
FIG. 8 is a flowchart in the continuation of the flowchart in FIG. 7, for performing tests in read mode with lag in the transmission time of the ACK signal according to the controlled test, in accordance with the invention.

Consider first the case of read mode (RWbar=1), whose progress is presented in FIG. 8, and this after selecting the "Set JKOTP" test mode. In the diagram, a short state at the time of the presence of a state case; any intervention: querying (diamond), etc. takes place in the state, until it passes to another state.

The read operation is the most constraining operation because the memory sends an ACK signal at the beginning. Then, the ACK signals are not transmitted by the recipient. Consequently, during the test mode, all the memory positioning operations must be managed in the desired test mode before the ACK signal is sent from the memory because it will provide the only return signal that allows verifying the correct operation of the operations performed at the memory level for passing to test mode.

To pass to the b0 state in test mode, the signal that sets RWbar to state 1 is sent over the SDA pin and the memory is placed in read mode. Because a delay occurs when entering the Set JKOTP test mode, the b0 state is the ninth state from the beginning.

At this stage, the system is still in b0 state because the state has not been modified. In this mode a locked ("latched") read operation is performed, where the ENRE, PCR, and PCC signals allow selecting and activating various circuit elements that will authorize the read operation and selecting the area to be read (box C26).

The state machine then performs a test on the high voltage by the PRE signal (box C28). If PRE=0, it deduces that the memory has been placed back in normal mode and generates the READ (box C30) and ACK (box C32 ) read signals in a normal manner. The READ signal performs the read operation in the memory level and the ACK signal present in this case at the ninth clock cycle (following the ninth state), constitutes the acknowledgement of the command for this read operation. (Note that the ACK signal appears, more precisely, on the trailing edge of the ninth clock cycle and is sampled at the tenth cycle).

On the other hand, if PRE=1 (box C28), then the memory passes to the mode targeting a specific read test, by passing into at least one additional mode before producing the READ and ACK signals.

The example indicates three read test modes: DMA, CGext, and a combination of both. These modes are activated by the increase of the high voltage over a WCbar pin at the same time, respectively, than the 10th and 11th clock cycles. They can be combined by maintaining the high voltage over these two clock cycles simultaneously.

The protocol is therefore the same as the standard read protocol. The only difference being the high voltage presented over the WCbar pin.

The CGext mode consists in forcing a read threshold voltage level from the outside (for example, via the WCbar pin) during the read operation. This voltage replaces the CGint threshold applied internally. This allows determining whether or not the cells are outside the expected limits for the threshold voltage, as explained above. Similarly, the contents of the memory will not comply with the read operation in client mode.

Furthermore, the DMA (direct memory access) mode allows forcing a reference current over a pin (for example, SDA) during the read operation: This current will be compared to the cell current of the memory layer (the internal current source is then deactivated). If the cells are outside the expected limits, the read operation again will not comply with the read operation in client mode.

These two modes can be activated simultaneously in order to combine them.

In the example, the three different test modes indicated each cause an additional delay that is different form the ACK signal output, in number of clock signals, as follows:

i) only DMA test—an additional delay cycle,
ii) only CGext test—two additional delay cycles, and
iii) CGext and DMA—three additional delay cycles.

These delays intervene after the b0 signal and before the ACK signal is output. Each delay constitutes an additional state of the state machine and delays the appearance of the ACK signal of a clock cycle. These additional states are in cascade form, the passing from one state to another in the cascade is done over consecutive clock cycles and continues until the high voltage (PRE=1) is present over the WCbar line. The interruption of the high voltage over WCbar during a given state thus allows interrupting the process of passing in cascade and selecting a chosen test mode, which corresponds to the test mode associated with the state at which the interruption takes place. After an interruption, the state machine passes to the ACK signal transmission mode (box C32). Thus, the test mode is chosen by acting on the presence/absence of the high voltage applied to the WCbar pin over the identified clock cycles. Of course, if the test mode corresponding to the last state of the cascade is selected (mode iii in the example), the high voltage is simply maintained on the WCbar pin in order to complete the state cascade, which will naturally be succeeded by the ACK signal transmission state.

This process is identified in the diagram in FIG. 8 as follows.

The cascade begins at the state of bit b0 and the querying of this state of the PRE signal (box 28) for the case giving PRE=1. This connection ends in an additional state identified at the DMA test mode, called only DMA test state (box C34):

If the chosen test mode is the only DMA test, the high voltage is decreased to 0V over the WCbar pin (PRE=0) during this only DMA test state. The state machine interrogates this PRE signal state (box C36) and deduces from the PRE=0 condition that there are no additional new states expected. It generates the test signals of the only DMA test mode (box C38) and sends the ACK signal to the next state (box C32). The ACK signal appears then with a delay of two states—therefore with two cycles—with respect to a read operation in normal mode. By checking that this is indeed the case (appearance of ACK at the eleventh cycle), the user ensures that the memory has correctly taken the Set JKOTP and only DMA test mode command into account;

If the test mode chosen is the only CGext test, the high voltage line is not decreased to 0V on the WCbar pin when the state is only DMA test, and the state machine then detects the PRE=1 condition when it queries the box C36. In response, it inserts a new additional state, called CGext (box C40) that increases the total number of additional tests to three. At this only CGext state, the state machine queries the PRE signal (box C42). If the WCbar pin is reset to 0V (PRE=0), the state machine is placed in only CGext test mode and generates signals for this test mode (box C44). Then, it sends the ACK signal to the next state (box C32) as in the previous case. Only, this signal therefore appears with three delay states—and therefore three clock cycles—that is, at the twelfth cycle indicating the taking into account of the Set JKOTP and only CGext test mode command;

If the test mode chosen is the DMA and CGext test, the WCbar pin is maintained at high voltage during the CGext test state (giving PRE=1 to box C42). In response, the state machine inserts a new and fourth additional state, called DMS & CGext test mode (box C46). This is therefore the last possible test from among the three foreseen. No other querying of the PRE signal is necessary. The state machine generates the signals of the DMA & CGext test mode (case C48) and then sends the ACK signal with four delay states—and therefore four clock cycles—that is, at the thirteenth cycle indicating the taking into account of the Set JKOTP and DMA & CGext test mode command.

From the above, it is understood that obtained, on the one hand, is the verification of the effective activation of the memory in test mode, and on the other, of the memory being placed in the correct test mode from all the test modes possible by identifying, respectively, whether the ACK signal sent by the memory is delayed, and from what number of clock cycles it is delayed with respect to the normal mode protocol. In the example, this approach allows establishing the desired test mode by acting on the duration of the high voltage applied on the WCbar pin, in terms of number of clock cycles, and ensuring that the ACK signal transmitted by the memory does not appear after this imposed high voltage.

Figure 6:
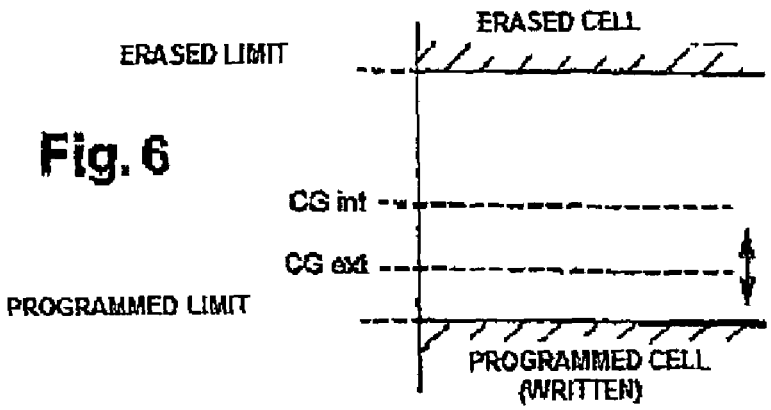
FIG. 6 is a principal diagram that illustrates the voltage detection thresholds of the cells in an EEPROM memory, which allow determining the erasure or writing state.

Note that the Set JKOTP test mode (box C20, FIG. 6) is combined in the example with the three above mentioned read test modes. It is also possible to enter into any of these three read test modes outside the Set JKOPT test mode. In this case, the WCbar pin passes to 0V after bit b1, giving PRE=0 after the querying then performed (see, FIG. 6, cell C18). The state machine reacts according to the normal mode by passing to bit b0 at the eighth state. Everything that follows regarding the three test modes is therefore as in the cases described referring to FIG. 8, except that the delays are reduced one state and thus a clock cycle: transmission of the ACK signal to the tenth clock cycle for the DMA test mode, to the eleventh clock cycle for the CGext test mode, and to the twelfth clock cycle for the DMA & CGext test mode.

After the memory sends the ACK signal (box C32), the protocol is followed in a normal manner. In that way, the state machine then transmits the SDA signals; that is, the D7–D0 data that was read (box C50), and goes into standby to await receipt of the ACK signal from the microcontroller (box C52). If this signal is detected, (box 54), the state machine prepares to do a loopback (Br1 exchange) over a read operation and transmission of the next eighth bits of data of the memory layer (box C50), according to the indication given by an internal pointer, and so on. The microcontroller transmits an ACK signal to the memory upon receiving each eight-bit data string received.

Note that in read mode, the memory transmits the ACK signal only once, before sending the read data, and that it is therefore only this signal that can be used to verify the correct identification of the desired mode.

The principle of the invention is also applicable to the case of a data write mode into the memory. Only there is more latitude for the choice of the ACK signal used for verification due to the fact that the memory transmits several such signals, including one after each eight-bit string received for writing.

Figure 9:
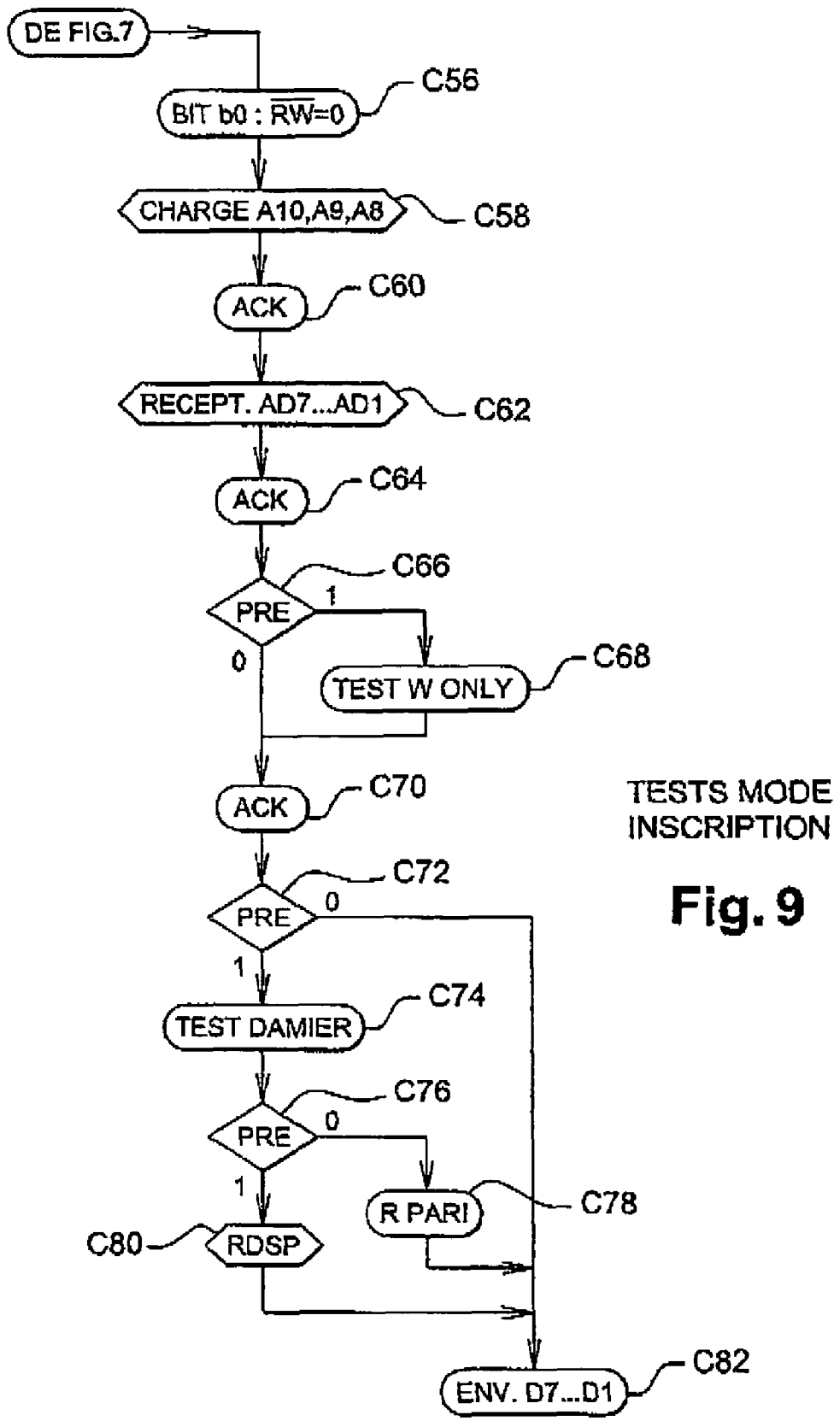
FIG. 9 is a flowchart in the continuation of the flowchart in FIG. 7 for performing tests in write mode with lag in the transmission time of the ACK signal according to the controlled test, in accordance with the invention.

The principle of delaying the ACK signal to indicate the test mode in the case of write tests will now be described referring to FIG. 9.

Figure 7:
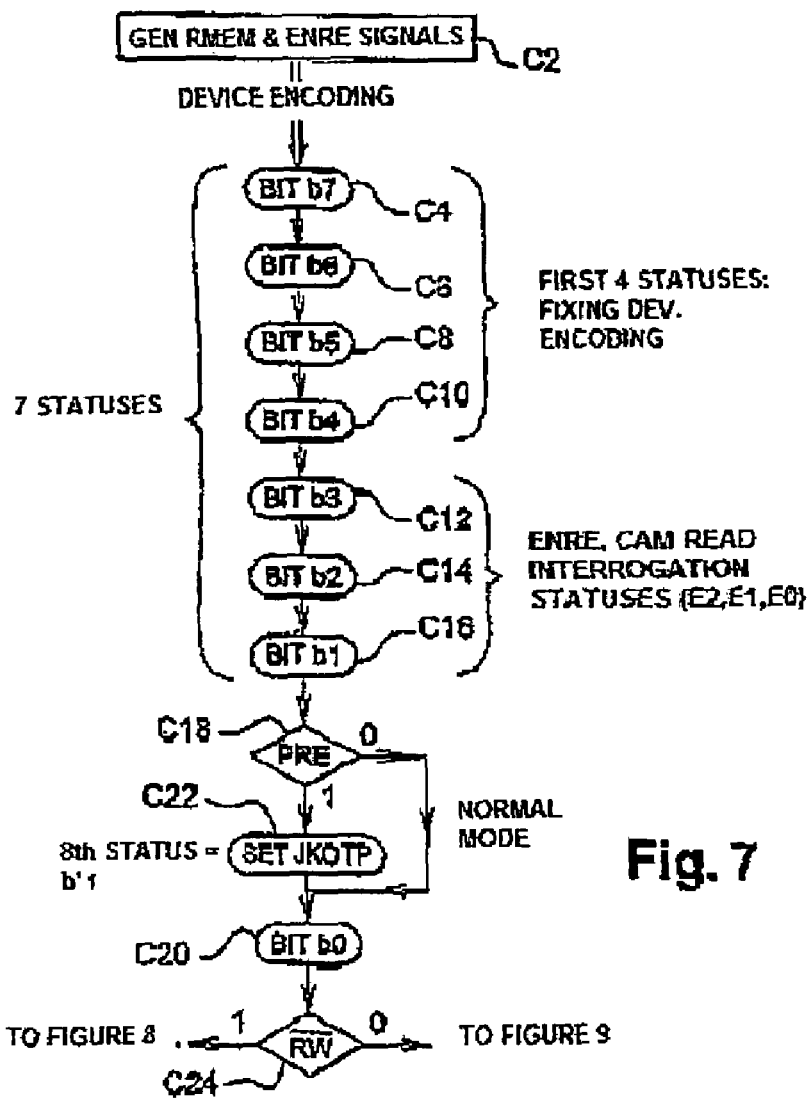
FIG. 7 is a flowchart of the operation of a state machine implemented by a PLA of EEPROM memory according to an embodiment of the invention, which allows creating additional states that correspond to the respective tests. Each state delays the transmission of the ACK signal of a cycle.

The system passes to write state with or without passing through the Set JKOTP test (FIG. 7, box 22).

The memory identifies the write mode by the positioning of the bit b0 to RWbar=0 (see FIG. 7, box C24). The microcontroller loads bits A10, A9, and A8 (box C58) into the memory. Then, the state machine transmits an ACK signal (box C60). In response, the microcontroller sends to the memory bits AD7–AD0 corresponding to the data write address (box C62). After the last bit AD0 is loaded, the memory transmits an ACK signal (box C64).

The example indicates the possibility of controlling a test mode, called Wonly (write only) by powering up the WCbar pin when the last bit AD0 is transmitted. Recall that this test consists in performing a write operation on a cell or several cells, without previously performing an erase cycle (normal writing of a data element in the memory includes this erasing cycle in a two-phase operation: erase and write).

After the bit AD0 is loaded, the state machine queries the PRE signal (box C66). If PRE=1, it creates a new Wonly state (box C68), and thus delays from a clock cycle the transmission of the ACK signal (box C70). Thus, the user can verify whether the memory has correctly taken an input command in the Wonly test mode into account by determining if the ACK signal is indeed delayed from a delay cycle after bit AD0.

From this ACK signal transmission state, a test mode called "checkerboard" can be controlled by applying a high voltage over the WCbar pin. The state machine thus queries the new PRE signal (case C72). If PRE=0, it passes to normal mode and prepares to accept new data to be written.

If PRE=1, the state machine enters an additional state corresponding to the "checkerboard" test that delays from a clock cycle the appearance of the ACK signal to be received.

From this state, another test can be controlled by setting the WCbar pin to 0V. Thus, the state machine queries to this state the PRE signal (box C76). If PRE=0, it passes to a new state, called RPARI (box C78), causing a new delay of the cycle upon data transmission.

If PRE=1, the machine does not produce any new states. It sends an RDSP signal (box C80) and passes to the D7–D0 data transmission states that correspond to the address, in compliance with the I2C protocol (box C82).

As with the read test modes, the various delays added by the additional states allow controlling whether the memory has correctly acknowledged the transmitted test commands.

Note that the all of the various test modes are controlled by the bias of a same signal; that is, the high voltage or absence thereof applied to the WCbar pin normally used to establish the authorization/denial of writing operations in normal mode.

From the above, the embodiment can be compared with the normal selection technique of test modes known, as indicated below, for the case of read test modes. In the state of the technique, the CGext and DMA modes are activated by the CGONPAD and DMA signals, the read operation is performed by the READ signal; the ENRE signal authorizes the read operation, the PCR and PCC signals preload the lines and columns, and the ACK signal is used to send the acknowledgement on the trailing edge of the next clock.

In the embodiment, the protocol is always taken into account, but new states are introduced before the transmission of the ACK signal by the test mode. Thus, in the state of the technique, the read operation (READ) is performed on the 8th clock cycle and the ACK signal is sent over the next trailing edge.

Within the scope of the invention, this remains true for the client mode.

On the other hand, in DMA mode, the read operation will be performed on the 9th clock cycle (or the 10th if the Set JKOTP test mode is also requested) and the ACK signal will be sent over the next clock pulse edge.

In CG mode, the read operation is done on the 10th clock cycle (or the 11th if the Set JKOTP test mode is requested) and the ACK signal will be sent over the next trailing edge of the clock.

In CG mode combined with DMA, the read operation is performed on the $11^{th}$ clock cycle (or the 12th if the Set JKOTP test mode is also controlled) and the AC signal will be sent over the next clock trailing edge.

As such, the appearance of the acknowledgement (ACK) is declared according to the read or write test mode. This ensures the test program that the command was correctly interpreted. This allows increasing the reliability of the production test flows.

Of course, the test modes and the arrangement of additional states can be varied.

The invention was presented within the general scope of the verification of the taking into account of test modes for a memory. Nonetheless, it is clear that the teachings of the invention are directed more generally at any processes of verification of the activation of a desired mode of a device that transmits a given signal at an expected time, and it is within the scope of any communication protocols in which these teachings can be inscribed, and of all states or modes to be controlled. The delay in time of the appearance of this signal according to the activation of this mode or not will then provide a way of verification. As an example, the invention can also be implemented in any dialogue-based system between two or more devices:

host and peripheral processor,
communication system between a transmitter and a transponder;
etc.

What is claimed is:

1. A method for identifying an operating mode of a device, said method comprising the steps of:
   communicating according to a communication protocol, the communication protocol specifying specific sending times for signals that are communicated via the communication protocol; and
   identifying at least one operating mode of the device based on a time lag associated with a signal sent via the communication protocol, the time lag corresponding to a time the signal is sent relative to a sending time for the signal that is specified by the communication protocol.

2. The method according to claim 1, wherein the signal is a return signal transmitted in response to a message received by the device.

3. The method according to claim 1, wherein the communication protocol is an industry standard protocol.

4. The method according to claim 3, wherein the protocol is "I2C" (Inter Integrated Circuit), and the signal is the "ACK" or "ACKNOWLEDGE" signal of the I2C protocol.

5. The method according to claim 1, further comprising the step of:
   controlling an operating mode of the device by applying command signals at preset times,
   wherein the controlling step includes the sub-steps of:
      analyzing a condition at specific times, indicating the correct acknowledgement of the command; and
      if the condition indicates acknowledgement of the command, sending the signal in accordance with this operating mode.

6. The method according to claim 1, wherein the identifying step includes the sub-step of, for at least one operating mode, delaying the transmission of the signal with a preset delay relative to the sending time for the signal that is specified by the communication protocol.

7. The method according to claim 1, wherein the identifying step includes the sub-step of forcing various time lags in the transmission of the signal relative to the sending time for the signal that is specified by the communication protocol, in order to identify various operating modes.

8. The method according to claim 1, wherein the mode to be identified is an operating mode of the device from among either:
   a normal operating mode and at least one test mode, or
   a set of possible test modes, each identified by a specific positioning in time of the transmission of the signal.

9. The method according to claim 8, wherein the signal is transmitted at the sending time for the signal that is specified by the communication when the operating mode of the device is the normal operating mode.

10. The method according to claim 1, wherein the protocol works on the basis of clock cycles, and the time lag of the signal is one or more clock cycles.

11. The method according to claim 10, wherein the time lag of the transmission of the signal is done by performing the sub-step of selectively adding at least one subsequent stage to the transmission of the signal, with each stage occupying at least one clock cycle.

12. The method according to claim 11, further comprising the step of governing operation of the device by a state machine that evolves in consecutive states in accordance with the protocol, and selectively channeling to at least one additional state, depending on the operating mode of the device.

13. The method according to claim 12, wherein there are a plurality of additional states and at least some of the additional states are accessed in cascade form, with access to a given cascade level depending on the operating mode.

14. The method according to claim 1, wherein the device is a memory device.

15. The method according to claim 14, wherein the memory device is an electrically programmable and erasable memory.

16. The method according to claim 14, wherein the identification serves to identify at least one data read test mode.

17. The method according to claim 14, wherein the identification serves to identify at least one data write test mode.

18. The method according to claim 14, wherein the identification serves to identify at least one test among:
   in read mode or write mode:
      a test to activate at least one specific line of the memory circuits, designed for internal use;
   in read mode:
      a direct memory access test,
      a test with application of an external cell state level detection threshold, and
      the combination of the direct memory access test and the test with application of an external cell state level detection threshold;
   in write mode:
      a write test without a prerequisite erasure cycle, and
      a checkerboard test.

19. The method according to claim 1, further comprising the step of selecting the operating mode by applying a mode command signal on a contact point at given times.

20. The method according to claim 19, wherein the time lag is produced at least partially based on the mode command signal.

21. The method according to claim 19, wherein any operating mode identified is controlled only through the mode command signal, present at specific times, with each of these times corresponding to an operating state or cycle of the device and associated with a specific operating mode.

22. The method according to claim 19,
   wherein the controlled device is a memory, and
   the mode command signal is applied to write control contact point that normally controls authorization/denial for writing data.

23. A method of detecting an operating mode of a device, the device communicating according to a communication protocol, said method including the steps of:
   matching each operating mode to be detected with lag value in the transmission time of a signal;
   establishing communication with the device using the communication protocol, the communication protocol specifying specific sending times for signals communicated via the communication protocol;
   determining a transmission lag from the transmission time of the signal by the device relative to a sending time for the signal that is specified by the communication protocol; and
   obtaining the operating mode of the device based on the transmission lag.

24. A method for controlling and verifying an operating mode of a device, the device communicating according to a communication protocol that specifies that signals are sent at specific times, said method including the steps of:
   matching each operating mode to be detected with a lag value in the transmission time of a signal;
   establishing communication, with the device using the communication protocol, the communication protocol specifying specific sending times for signals communicated via the communication protocol;
   controlling the operating mode of the device to be a desired operating mode;
   determining a transmission lag from the transmission time of the signal by the device relative to a sending time for the signal that is specified by the communication protocol;
   obtaining the operating mode of the device based on the transmission lag; and
   comparing the operating mode that is obtained with the desired operating mode.

25. The method according to claim 24, wherein the step of controlling the operating mode includes the sub-step of applying a mode command signal on a contact point of the device.

26. A method for a device to signal its operating mode, the device communicating according to a communication protocol, said method including the steps of:
   matching each operating mode to be detected with lag value in the transmission time of a signal;
   receiving an operating mode activation command for setting the operating mode of the device;
   establishing the transmission time of the signal based on the operating mode set by the operating mode activation command, in conformance with the lag value that matches that operating mode; and
   sending the signal at the transmission time,
   wherein the communication protocol specifies specific sending times for signals that are communicated via the communication protocol.

27. An identification device for identifying an operating mode of a controlled device, the controlled device communicating according to a communication protocol that specifies that signals communicated according to the communication protocol are sent at specific times, said identification device including:
   an identifier for identifying at least one operating mode of the controlled device through a time lag from a time a signal is transmitted relative to a sending time for the signal that is specified by the communication protocol.

28. The identification device according to claim 27, further including:
   command means for commanding an operating mode of the controlled device, the command means applying command signals to the controlled device at preset times;
   analysis means for analyzing a condition, at given times, that indicates correct acknowledgement of the command;

transmission means for, if the condition indicates the correct acknowledgement of the command, positioning in time the transmission of the signal in accordance with the operating mode.

29. The identification device according to claim 27, wherein the controlled device includes a state machine that evolves in consecutive states in accordance with the protocol, and that is selectively channeled to at least one additional state, depending on the operating mode of the controlled device.

30. The identification device according to claim 27, wherein the controlled device is a memory device.

31. The identification device according to claim 30, wherein the memory device is an electrically programmable and erasable memory.

32. The identification device according to claim 30, wherein the identification serves to identify at least one data read test mode.

33. The identification device according to claim 32, wherein the identification identifies at least one test among:
    in read mode or write mode:
        a test to activate at least one specific line of the memory circuits, designed for internal use;
    in read mode:
        a direct memory access test,
        a test with application of an external cell state level detection threshold, and
        the combination of the direct memory access test and the test with application of an external cell state level detection threshold;
    in write mode:
        a write test without a prerequisite erasure cycle, and
        a checkerboard test.

34. The identification device according to claim 30, wherein the identification serves to identify at least one data write test mode.

35. A detection device for detecting an operating mode of a controlled device, the controlled device communicating according to a communication protocol, said detection device including:
    storage for storing a match between each operating mode to be detected and lag value in the transmission time of a signal;
    means for establishing communication with the controlled device using the communication protocol, the communication protocol specifying specific sending times for signals communicated via the communication protocol;
    means for determining a transmission lag from the transmission time of the signal by the controlled device relative to a sending time for the signal that is specified by the communication protocol; and
    means for obtaining the operating mode of the device based on the transmission lag.

36. A command device for commanding and verifying an operating mode of a controlled device, the controlled device communicating according to a communication protocol, said command device including:
    storage for storing a match between each operating mode to be detected and a lag value in the transmission time of a signal;
    means for establishing communication with the controlled device using the communication protocol, the communication protocol specifying specific sending times for signals communicated via the communication protocol;
    means for controlling the operating mode of the device to be a desired operating mode;
    means for determining a transmission lag from the transmission time of the signal by the controlled device relative to a sending time for the signal that is specified by the communication protocol;
    means for obtaining the operating mode of the device based on the transmission lag; and
    means for comparing the operating mode that is obtained with the desired operating mode.

37. A signaling device for signaling an operating mode of a controlled device, the controlled device communicating according to a communication protocol, said signaling device including:
    storage for storing a match between each operating mode to be detected and a lag value in the transmission time of a signal;
    means for receiving an operating mode activation command for setting the operating mode of the device;
    means for establishing the transmission time of the signal based on the operating mode set by the operating mode activation command, in conformance with the lag value that matches that operating mode; and
    means for sending the signal at the transmission time,
    wherein the communication protocol specifies specific sending times for signals that are communicated via the communication protocol.

38. A semiconductor memory device that communicates according to a communication protocol that specifies that signals communicated according to the communication protocol are sent at specific times, said memory device including:
    an identifier for identifying at least one operating mode of the memory device through a time lag from a time a signal is transmitted relative to a sending time for the signal that is specified by the communication protocol.

39. The memory according to claim 38, wherein the memory device is an electrically programmable and erasable memory.

40. A state machine for governing operation of a device, the state machine evolving in consecutive states in accordance with a communication protocol, said state machine including:
    means for communicating according to the communication protocol, the communication protocol specifying specific sending times for signals communicated via the communication protocol; and
    means for identifying at least one operating mode of the device by a time lag from a time a signal is sent relative to a sending time for the signal that is specified by the communication protocol,
    wherein the communication protocol works on the basis of clock cycles, and the time lag of the signal is one or more clock cycles,
    the time lag of the transmission of the signal is obtained by selectively adding at least one subsequent stage to the transmission of the signal, with each stage occupying at least one clock cycle, and
    the state machine includes means for selectively channeling to at least one additional state, depending on the operating mode of the device.

41. The state machine according to claim 40, wherein the state machine is implemented in a programmable logic array.

* * * * *